(12) United States Patent
Milliken

(10) Patent No.: US 7,028,244 B2
(45) Date of Patent: *Apr. 11, 2006

(54) NETWORK PROCESSOR HAVING CYCLIC REDUNDANCY CHECK IMPLEMENTED IN HARDWARE

(75) Inventor: Walter Clark Milliken, Dover, NH (US)

(73) Assignee: BBNT Solutions LLC, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/880,281

(22) Filed: Jun. 29, 2004

(65) Prior Publication Data

US 2004/0243729 A1 Dec. 2, 2004

Related U.S. Application Data

(63) Continuation of application No. 09/949,354, filed on Sep. 7, 2001, now Pat. No. 6,848,072.

(60) Provisional application No. 60/233,578, filed on Sep. 19, 2000.

(51) Int. Cl.
*H03M 13/00* (2006.01)

(52) U.S. Cl. .................................... 714/781; 714/776
(58) Field of Classification Search ................ 714/781, 714/758, 807, 52, 48
See application file for complete search history.

(56) References Cited

U.S. PATENT DOCUMENTS

| | | | |
|---|---|---|---|
| 4,712,215 A | 12/1987 | Joshi et al. | |
| 4,991,133 A | 2/1991 | Davis et al. | |
| 6,192,491 B1 | 2/2001 | Cashman et al. | |
| 6,192,498 B1 | 2/2001 | Arato | |
| 6,456,875 B1 | 9/2002 | Wilkinson et al. | |
| 6,631,488 B1 | 10/2003 | Stambaugh et al. | |
| 6,836,869 B1 * | 12/2004 | Wyland | 714/781 |
| 6,848,072 B1 * | 1/2005 | Milliken | 714/781 |

* cited by examiner

*Primary Examiner*—Phung My Chung
(74) *Attorney, Agent, or Firm*—Fish & Neave IP Group Ropes & Gray LLP

(57) ABSTRACT

A network processor [200] performs Cyclic Redundancy Check (CRC) operations using specialized hardware circuits [308-308]. The network processor [200] includes a plurality of hardwired CRC polynomials that are used to implement the CRC operations. A CRC instruction selects which polynomial to use when performing the CRC operation.

11 Claims, 4 Drawing Sheets

NETWORK PROCESSOR HAVING CYCLIC REDUNDANCY CHECK IMPLEMENTED IN HARDWARE

RELATED APPLICATION

This application is a continuation of, and claims priority to, U.S. patent application Ser. No. 09/949,354, filed Sep. 7, 2001 now U.S. Pat. No. 6,848,072, which claims priority under 35 U.S.C. § 119 to U.S. Provisional Application No. 60/233,578, filed Sep. 19, 2000, the disclosures of which are incorporated herein by reference.

BACKGROUND OF THE INVENTION

A. Field of the Invention

The present invention relates to network devices and, more specifically, to network devices designed to implement network protocols.

B. Description of Related Art

In digital communication systems, data is routinely transmitted over processing devices in a network. In packet based networks, for example, data is transmitted in discrete quantities known as packets. A packet destined for a remote computer is typically transmitted through multiple intermediate network destinations (e.g., through routers, switches, or bridges) before reaching its final destination. At each intermediate destination, the intermediate network device may examine the packet and, based on the examination, determine the packet's next intermediate destination (or hop).

Each intermediate network device runs one or more protocols that define how the device is to forward its received packets. For example, the intermediate network device may assign the packet a high transmission priority, may apply quality of service rules to the packet, or perform error checking operations on the packet to ensure that the packet has not suffered transmission errors.

The protocols are often performed in the network devices by general purpose processors. In high performance network devices, such as high performance routers or switches, it can be difficult for these general purpose processors to keep up with the input data flow. Accordingly, specialized network processors, which implement frequently used network operations in hardware, have been developed. These specialized processors may be optimized for protocol processing.

One operation that may be implemented as a special instruction in a specialized network processor is a Cyclic Redundancy Check (CRC) error checking operation. CRC is the most common method of error detection for many data communication protocols. A CRC value is computed for a packet and attached to the packet during transmission. The device receiving the packet can verify the integrity of the packet by re-calculating the packet's CRC value and comparing it to the attached value.

Given the wide spread use of CRC based error checking techniques in data communication networks, there is a need in the art for special purpose processors that can perform CRC calculations in an efficient manner.

SUMMARY OF THE INVENTION

Systems and methods consistent with the present invention address these and other needs by providing for a set of hardware implemented CRC instructions in a network processor. The CRC hardware may include multiple hardwired CRC polynomials that are selectable via a CRC instruction.

A first aspect of the present invention is directed to a method for performing a CRC operation to generate a CRC result based on input data. The method comprises receiving an instruction to execute the CRC operation, the instruction including an indication of a polynomial to use in calculating the CRC result, and selecting a CRC circuit to use to perform the CRC operation based on the indication of the polynomial in the instruction, the CRC circuit including a CRC polynomial hardwired into the CRC circuit.

A second aspect of the present invention is directed to a network device comprising a number of elements, including an instruction store, and an arithmetic logic unit (ALU). The instruction store includes at least one CRC instruction that indicates that a CRC operation should be performed. The ALU is connected to the bus and includes at least one CRC circuit for generating a CRC result value based on hardwired CRC polynomials. The ALU receives input data for the CRC operation and the CRC instruction, and in response to the CRC instruction, generates the CRC result using the CRC circuit, the input data, and a selected one of the hardwired polynomials, the selected hardwired polynomial being selected based on the CRC instruction.

A third aspect of the present invention is directed to a device comprising a first CRC circuit and a second CRC circuit. The first CRC circuit performs a CRC operation on input data, the CRC operation being performed using a first polynomial, the first polynomial being hardwired into the first CRC circuit. The second CRC circuit also performs a CRC operation on the input data, the CRC operation being performed using a second polynomial hardwired into the second CRC circuit. Additionally, a demultiplexer receives an instruction indicating that the CRC operation is to be performed and which of the first and second circuits is to perform the CRC operation. The demultiplexer enables the indicated one of the first and second CRC circuits to generate a CRC output result based on the input data.

BRIEF DESCRIPTION OF THE DRAWINGS

The accompanying drawings, which are incorporated in and constitute a part of this specification, illustrate the invention and, together with the description, explain the invention. In the drawings.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

As is generally described herein, a network processor includes hardware for executing instructions relating to data transfer in a network. One of the instructions is a Cyclic Redundancy Check (CRC) instruction. The CRC instruction is implemented using hardwired CRC polynomials.

Figure 1:
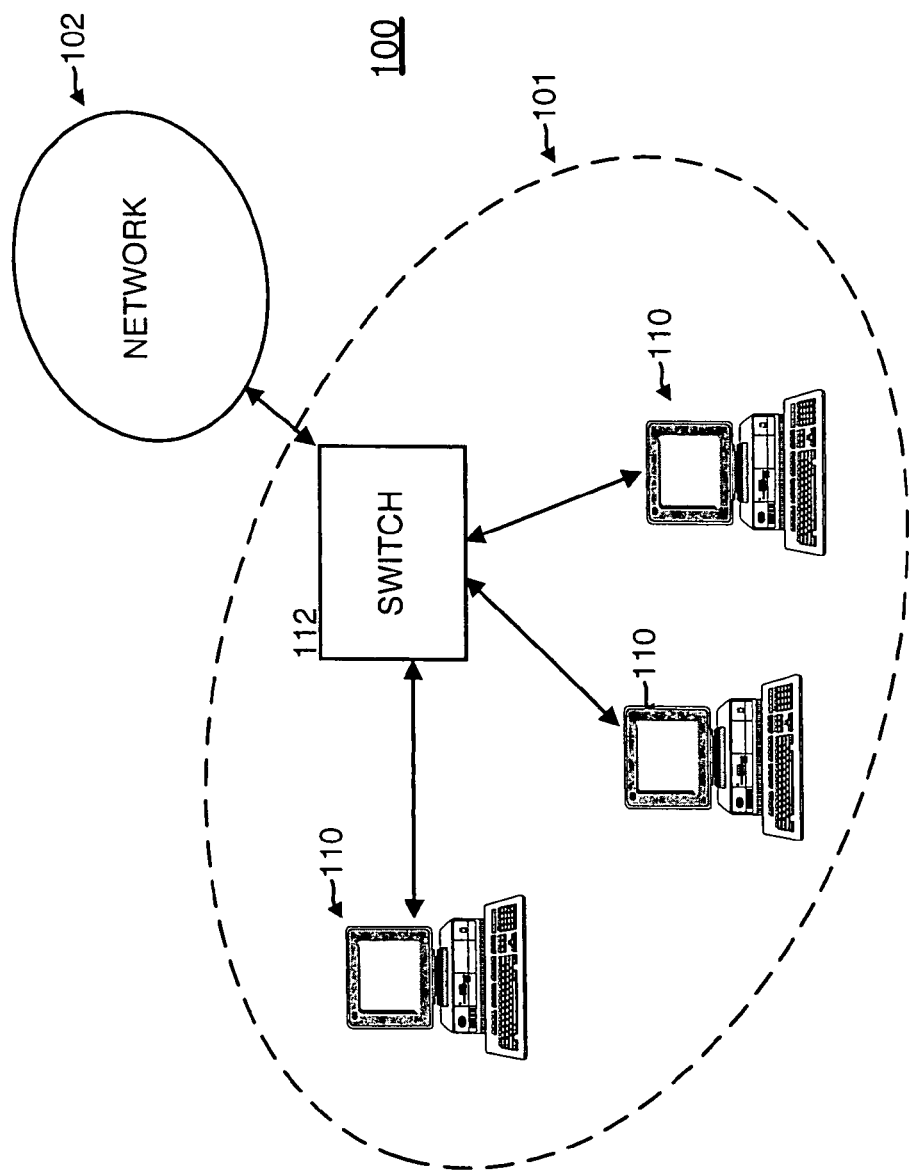
FIG. 1 is a high level diagram of an exemplary computer network in which systems and methods consistent with the present invention may be implemented.

FIG. 1 is a high level diagram of an exemplary computer network in which concepts consistent with the present invention may be implemented. The computer network 100 includes a local subnet network 101 connected to a wide area network 102. Local subnet 101 may be, for example, a local corporate network and wide area network 102 may be the Internet. Alternately, local subnet network 101 may be any other subnetwork within a larger wide area network 102. As shown, local subnet 101 includes a number of computing devices, such as personal computers 110. It should be understood that local subnet 101 may contain other computing devices, such as laptops and personal digital assistants. A switch (or alternately, a router) 112 forwards information between personal computers 110. Personal computers 110 may additionally communicate with devices through wide area network 102. In this situation, switch 112 may forward an information packet from one of personal computers 110 to network 102. For example, switch 112 may transmit a packet of information from one of personal computers 110 to an intermediate router (not shown) in network 102, which may then further forward the packet in the direction of the destination device.

Figure 2:
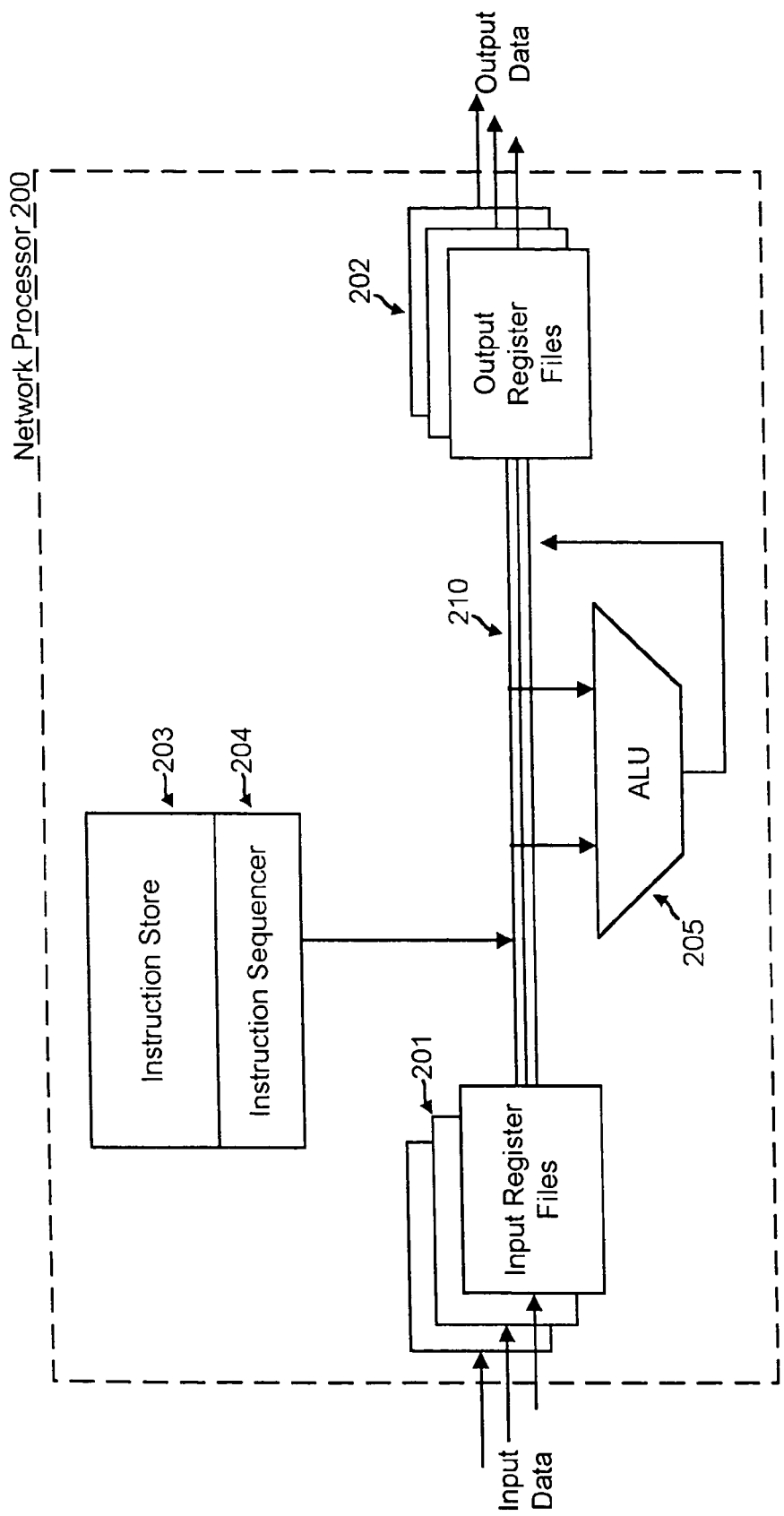
FIG. 2 is a diagram illustrating the architecture of a network processor.

It is desirable for switch 112 to be able to handle high volumes of network traffic. Switch 112 may therefore include specialized network processors designed to perform network forwarding functions as quickly as possible. FIG. 2 is a diagram illustrating, at a high-level, the architecture of such a network processor, illustrated as network processor 200.

In general, the architecture of network processor 200 is implemented as a set of functional units interconnected by a wide data bus and controlled by a horizontal microcode sequencer. More particularly, network processor 200 includes input register files 201, output register files 202, an instruction store 203, an instruction sequencer 204, an ALU 205, and a bus 210. Input data is received at input register files 201, which may each correspond to an input port of the network processor 200. Data in one of input register files 201 may be quickly output to data bus 210 as a single "chunk" of data. Similarly, chunks of data on bus 210 can be quickly received by register files 202 and forwarded to appropriate output ports. Bus 210, although shown as a number of parallel signal lines, may alternatively be implemented as a crossbar switch.

The operation of network processor 200 is controlled by instructions stored in instruction store 203. Instruction sequencer 204 controls the transmission of instructions from instruction store 203 to ALU 205 over bus 210. ALU 205 may execute network processing functions based on input data and the instructions from instruction store 203. The resultant data may then be transmitted to output register files 202, and from there, may be transmitted to appropriate output ports of the network processor 200. In an alternate implementation, bus 210 may be divided into a dedicated instruction bus and a dedicated data bus.

As previously mentioned, network processor 200 may implement CRC operations on its input data. To increase the speed of the CRC operation, it may be implemented in hardware in ALU 205.

In general, CRC operations are used as a way of detecting small changes, such as transmission errors, in blocks of data. The CRC operation operates on a block of data as a unit. The block of data can be conceptualized as a single (large) numerical value. The CRC algorithm divides this large value by a number (the CRC polynomial or generator polynomial), leaving the remainder, which is the CRC result. The CRC result can be sent or stored along with the original data. When the data is received (or recovered from storage) the CRC operation can be reapplied, and the latest result compared to the original result. If no error has occurred, the CRC results should not match.

Different CRC polynomials are possible in different CRC implementations. The CRC polynomials are generally designed and constructed to have desirable error-detection properties. In general, longer polynomials provide more assurance of data accuracy and are fully useable over larger amounts of data; however, longer polynomials also produce longer remainder values, which add additional error-checking overhead to the data.

Polynomials are classified in the art by their highest non-zero digit or exponent, which is termed the degree of the polynomial. For example, a common 16-degree polynomial is $x^{16}+x^{12}+x^5+1$. In the computation of the CRC result, the CRC input value is divided by the polynomial, and the remainder is the CRC result. When using base two (binary) arithmetic, the remainder value may be calculated by a hardware circuit to increase performance.

Figure 3:
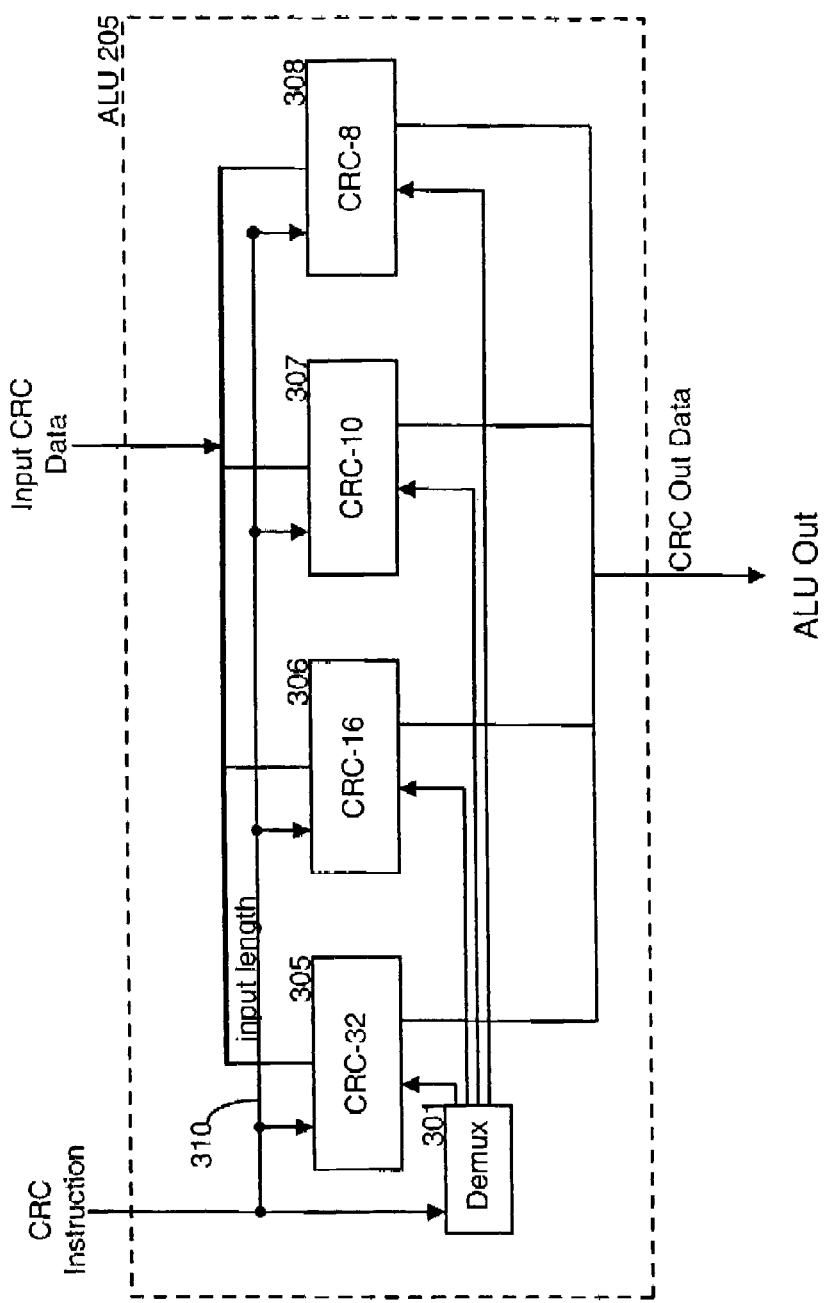
FIG. 3 is a diagram illustrating an ALU in the network processor shown in FIG. 2.

FIG. 3 is a diagram illustrating components of ALU 205 relevant to the hardware execution of CRC operations. ALU 205 may implement a number of different types of CRC operations. More specifically, as shown in FIG. 3, ALU 205 includes CRC-32 circuit 305, CRC-16 circuit 306, CRC-10 circuit 307, and CRC-8 circuit 308. CRC circuits 305–308 may execute CRC operations based on 32, 16, 10, and 8 bit polynomials, respectively. Each of the polynomials may be hardwired into the respective circuits 305–308.

Demultiplexer 301 receives the CRC instruction from instruction store 203. Instructions that indicate that a CRC operation is to be performed also indicate which of circuits 305–308 is to perform the CRC operation. Demultiplexer 301 selects the appropriate one of the circuits 305–308 when the instruction indicates a CRC instruction. ALU 205 also receives the input CRC data that is to be processed in the CRC operation. The selected circuit 305–308 performs the CRC operation on the input data and outputs the CRC results. Although the input CRC data is shown in FIG. 3 as being input on a single input data line, CRC circuits 305–308 may include two inputs: input data and current state value data. These two inputs can be concatenated together and conceptually considered as a single input value.

Input CRC instructions may optionally include an indication of the number of valid input bytes. Such as indication is illustrated in FIG. 3 as valid input length signal 310. In one possible implementation, the input CRC data is four bytes long.

Figure 4:
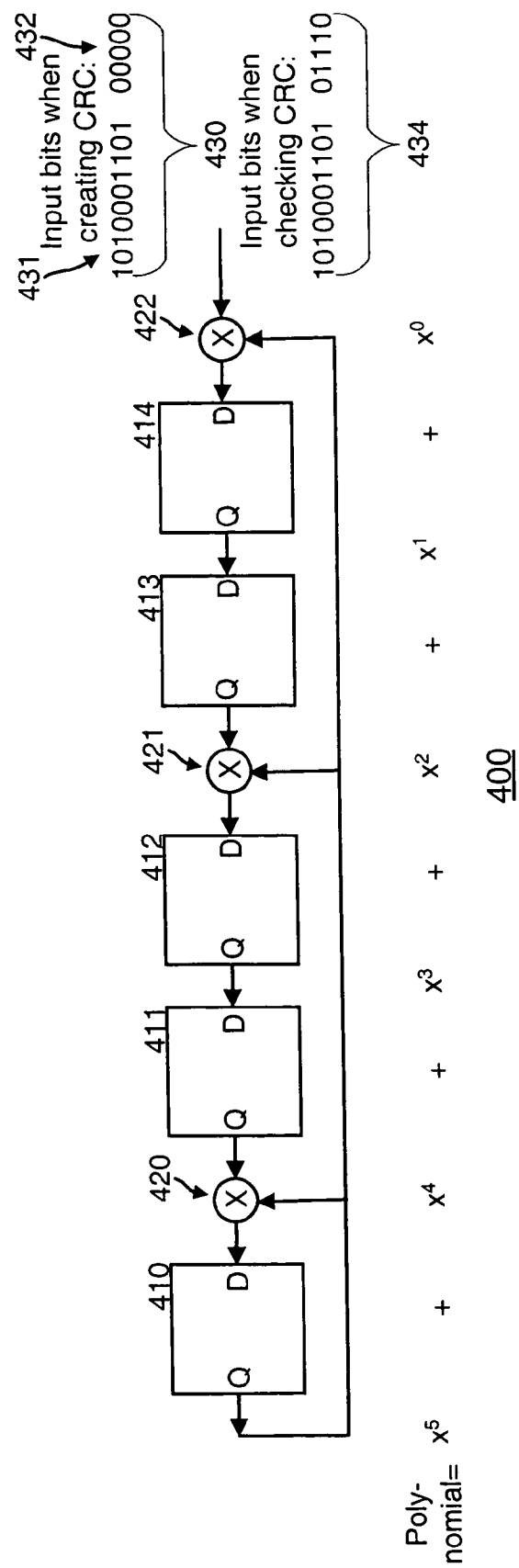
FIG. 4 is diagram of an exemplary CRC calculation circuit.

FIG. 4 is diagram of an exemplary CRC calculation circuit 400 for calculating a CRC result based on an input value. CRC calculating circuits 305–308 may be implemented similar to circuit 400.

CRC calculating circuit 400 implements a CRC polynomial of degree five. In practical implementations, such as circuits 305–308, polynomials of a degree higher than five are generally used. However, for clarity of explanation, polynomial calculation circuit 400 will be illustrated using the five-degree polynomial: $x^5+x^4+x^2+1$. The following polynomials may be used to implement the 8, 10, 16, and 32 degree polynomials: $x^8+x^2+x+1$ (CRC-8), $x^{10}+x^9+x^5+x^4+x+1$ (CRC-10), $x^{16}+x^{12}+x^5+1$ (CRC-16), $x^{32}+x^{26}+x^{23}+x^{22}+x^{16}+x^{12}+x^{11}+x^{10}+x^8+x^7+x^5+x^4+x^2+x+1$ (CRC-32).

CRC calculation circuit 400 includes five registers (one for each degree of the polynomial) 410–414 arranged in series. The registers may be delay type flip-flops. Logic gates 420–421 are placed between registers 410–414 at each non-zero place in the polynomial (except for the highest place—the fifth place in this example). As shown, the input to register 414 corresponds to the polynomial's zero place; the output of register 410 corresponds to the polynomial's fifth place; and the connections between registers 413 and 414, 412 and 413, 411 and 412, and 410 and 411 correspond respectively to the polynomial's first through fourth places. Thus, logic gate 420 is placed between registers 410 and 411 (the polynomial's fourth place), logic gate 421 is placed between registers 412 and 413 (the polynomial's second place), and logic gate 422 is placed before register 414 (the polynomial's zero place)

Logic gates 420–422 may be exclusive-or (XOR) gates. The output of register 410 is fed back into one of the inputs of each of logic gates 420–422.

Two exemplary 15-bit input values are illustrated in FIG. 4. The first 15-bit input value 430 includes input data portion 431 concatenated with five zeroes (current state portion 432). Portions 431 and 432 are sequentially input to logic gate 422. After the last bit is input to logic gate 422, the resultant value stored in registers 410–414 is the CRC result value (i.e., 01110). In this implementation, the total input value is a 20 bit number, and accordingly, CRC calculation circuit 400 may process this number in 20 clock cycles.

When checking the input data portion 431 based on a previously calculated CRC result value, network processor 200 concatenates the input data portion 431 with the previous CRC result value to form input value 434. Input value 434 is sequentially input to circuit 400 to produce the result value "00000" in registers 410–414. In this manner, CRC calculation circuit 400 initially generates the CRC result based on the CRC input data concatenated with five zero bits. When using a CRC circuit to subsequently check the integrity of the data, the data is concatenated with the CRC result value and input to the CRC circuit 400. If there are no errors in the data value, the new CRC result should be zero.

As described above, a network processor implements certain instructions, such as CRC operations, in hardware to increase processing efficiency. Multiple CRC operations, each potentially using a different polynomial, may be implemented in separate CRC circuits. The appropriate CRC circuit to use for a particular CRC operation is indicated in the CRC instruction.

In alternate implementations, instead of using four separate CRC circuits 305–308, a single CRC circuit could be used that includes four separate hardwired polynomials. At any given time, only one of the four hardwired polynomials may be in use by the circuit.

Additionally, although CRC circuit 400 is shown as a serial CRC circuit, in alternative implementations, the CRC circuit can be implemented as a parallel decomposition of the serial circuit shown in FIG. 4. Such a parallel embodiment could be implemented as a circuit of XOR gates. Although the parallel implementation would require a more complex circuit, it has the virtue of generating the CRC result in as little time as one clock cycle.

Because network processor 200 uses hardwired polynomials instead of software selectable polynomials, network processor 200 does not have to provide functionality to program any possible polynomial, thus the complexity of the CRC circuits can be reduced relative to a circuit that allows any polynomial to be used. Additionally, the reduced complexity of the CRC circuits may result in faster execution speeds for the CRC circuits.

The foregoing description of preferred embodiments of the present invention provides illustration and description, but is not intended to be exhaustive or to limit the invention to the precise form disclosed. Modifications and variations are possible consistent with the above teachings or may be acquired from practice of the invention. The scope of the invention is defined by the claims and their equivalents.

What is claimed:

1. A method for performing a Cyclic Redundancy Check (CRC) operation to generate a CRC result based on input data comprising:
   receiving an instruction indicating the CRC operation is to be executed, the instruction including an indication of a polynomial to use in calculating the CRC result;
   selecting one of a plurality of CRC circuits to perform the CRC operation based on the indication of the polynomial in the instruction, each of the plurality of CRC circuits including a CRC polynomial hardwired therein;
   receiving the input data at the selected CRC circuit; and
   generating the CRC result with the selected CRC circuit.

2. The method of claim 1, further comprising: appending the CRC result to the input data and transmitting the input data and the appended CRC result over a network.

3. The method of claim 1, wherein the input data is comprised of transmission data and a previous CRC result.

4. The method of claim 3, further comprising:
   determining that the input data contains errors when the CRC result is a non-zero value.

5. The method of claim 1, wherein the input data includes data from a packet of information received from a network.

6. A network processor comprising:
   a bus in communication with a plurality of hardwired Cyclic Redundancy Check (CRC) circuits, each CRC circuit implementing a CRC polynomial for generating a CRC result; and
   a switch for directing input data to at least one of the CRC circuits based on a CRC instruction; and
   an error detecting means for determining whether the input data includes an error based on the CRC result.

7. The network device of claim 6, further comprising:
   an input register file connected to the switch, and in communication to input ports of a network device.

8. The network device of claim 6, further comprising:
   output register files connected to the switch, the output register files receiving the CRC result generated by the CRC circuit to which the input data was directed.

9. The network device of claim 6, wherein the hardwired CRC polynomials include an eight-bit, a ten-bit, a sixteen-bit, and a thirty-two-bit polynomial.

10. A network processor comprising:
    a bus in communication with a plurality of preexisting Cyclic Redundancy Check (CRC) circuits,
    a switch for directing input data to at least one of the CRC circuits based on a CRC instruction based upon an indication of a polynomial included in a CRC instruction; and
    an error detecting means for determining whether the input data includes an error based on a CRC result output by the at least one CRC circuit to which the input data was directed.

11. A Cyclic Redundancy Check (CRC) logic unit comprising:
    an input register for storing input data;
    a plurality of hardwired polynomial circuits for processing the stored input data to generate a CRC result;
    a switch for directing input data stored in the input register to at least one of the polynomial circuits based on a CRC instruction; and
    an output register for storing the CRC result.

* * * * *

(12) INTER PARTES REEXAMINATION CERTIFICATE (1085th)

United States Patent
Milliken

(10) Number: US 7,028,244 C1
(45) Certificate Issued: *Apr. 3, 2015

(54) NETWORK PROCESSOR HAVING CYCLIC REDUNDANCY CHECK IMPLEMENTED IN HARDWARE

(75) Inventor: Walter Clark Milliken, Dove, NH (US)

(73) Assignee: Seesaw Foundation, Longview, TX (US)

Reexamination Request:
No. 95/002,303, Sep. 14, 2012

Reexamination Certificate for:
Patent No.: 7,028,244
Issued: Apr. 11, 2006
Appl. No.: 10/880,281
Filed: Jun. 29, 2004

(*) Notice: This patent is subject to a terminal disclaimer.

Related U.S. Application Data

(63) Continuation of application No. 09/949,354, filed on Sep. 7, 2001, now Pat. No. 6,848,072.

(60) Provisional application No. 60/233,578, filed on Sep. 19, 2000.

(51) Int. Cl.
*H03M 13/00* (2006.01)
*H03M 13/09* (2006.01)

(52) U.S. Cl.
CPC ............ *H03M 13/09* (2013.01); *H05K 999/99* (2013.01)
USPC ........................................ 714/781; 714/776

(58) Field of Classification Search
None
See application file for complete search history.

(56) References Cited

To view the complete listing of prior art documents cited during the proceeding for Reexamination Control Number 95/002,303, please refer to the USPTO's public Patent Application Information Retrieval (PAIR) system under the Display References tab.

*Primary Examiner* — Roland Foster

(57) ABSTRACT

A network processor [200] performs Cyclic Redundancy Check (CRC) operations using specialized hardware circuits [308-308]. The network processor [200] includes a plurality of hardwired CRC polynomials that are used to implement the CRC operations. A CRC instruction selects which polynomial to use when performing the CRC operation.

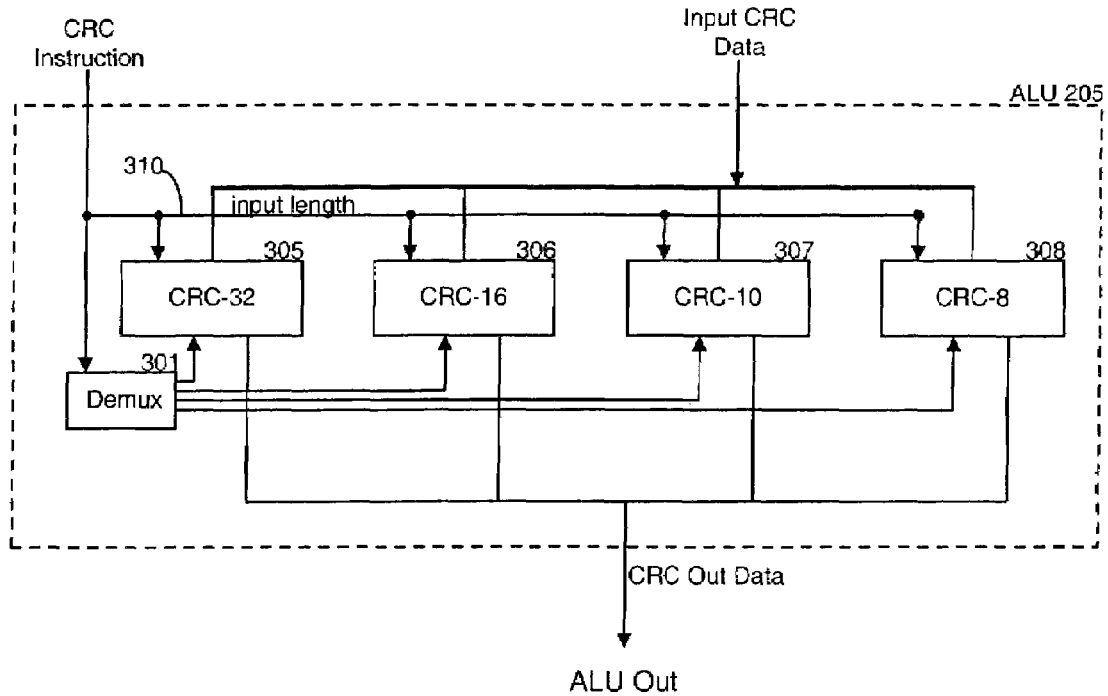

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-8, 10 and 11 are cancelled.
Claim 9 was not reexamined.

\* \* \* \* \*